United States Patent [19]

Takeuchi et al.

[11] Patent Number: 4,594,868
[45] Date of Patent: Jun. 17, 1986

[54] SYSTEM AND PLATE BENDING MACHINE FOR REGISTERING IN AN OFFSET PRINTING PRESS

[75] Inventors: Hideo Takeuchi, Chiba; Michiaki Kobayashi, Kitamoto; Hiroyuki Hashimoto, Tokyo; Daiji Suzuki, Hachioji, all of Japan

[73] Assignee: Dai Nippon Insatsu Kabushiki Kaisha, Tokyo, Japan

[21] Appl. No.: 631,200

[22] Filed: Jul. 16, 1984

Related U.S. Application Data

[62] Division of Ser. No. 434,241, Oct. 14, 1982, Pat. No. 4,489,652.

[30] Foreign Application Priority Data

Oct. 15, 1981 [JP] Japan .................. 56-164449
Jan. 25, 1982 [JP] Japan .................. 57-9882
Jan. 25, 1982 [JP] Japan .................. 57-9884
Jan. 25, 1982 [JP] Japan .................. 57-9886
Apr. 30, 1982 [JP] Japan .................. 57-73022

[51] Int. Cl.[4] ............................................ B21D 5/04
[52] U.S. Cl. .................................... 72/12; 72/37; 72/311; 72/319; 72/323; 72/294
[58] Field of Search ............... 72/311, 319-321, 72/323, 294, 37, 33, 10-12, 9; 83/367, 371, 365; 29/720, 714; 101/DIG. 12, 415.1, 401.1, 378, 248, 211, 426

[56] References Cited

U.S. PATENT DOCUMENTS

| | | | |
|---|---|---|---|
| 3,293,439 | 12/1966 | Marantette et al. | 83/365 |
| 3,329,181 | 7/1967 | Buss et al. | 83/365 |
| 3,415,433 | 12/1968 | Shaw et al. | 83/365 |
| 3,771,440 | 11/1973 | Eburn, Jr. | 72/294 |
| 3,914,974 | 10/1975 | DeVore | 72/319 |
| 4,218,909 | 8/1980 | Wright | 72/320 |
| 4,259,904 | 4/1981 | Metje | 101/415.1 |
| 4,365,500 | 12/1982 | Klukow | 72/319 |

FOREIGN PATENT DOCUMENTS

| | | | |
|---|---|---|---|
| 4063 | 2/1971 | Japan | 72/323 |
| 1128207 | 9/1968 | United Kingdom | 101/DIG. 12 |
| 2059627 | 4/1981 | United Kingdom | 101/DIG. 12 |

*Primary Examiner*—Daniel C. Crane
*Attorney, Agent, or Firm*—Koda and Androlia

[57] ABSTRACT

A method for registering in an offset printing press comprises: mounting a printing plate on a shiftable table of a plate bending machine; detecting datum fine lines on said plate, by means of optical sensors; shifting the shiftable table so that said datum fine lines are placed at specific positions; inscribing, by means of a register mark inscribing device, register marks for carrying out automatic registering while, at the same time, bending the lateral edges of the printing plate; thereafter mounting the printing plate on a corresponding plate cylinder of a printing press; and carrying out automatic registering. The above plate bending machine comprises plate bending mechanisms, a shiftable table for holding the printing plate, optical detection sensors disposed above the shiftable table and operating to detect datum lines on the plate and thereby to generate signals for the movement of the table and register mark inscribing devices for automatic registering on a plate cylinder of the printing press.

10 Claims, 51 Drawing Figures

FIG. 34(a)
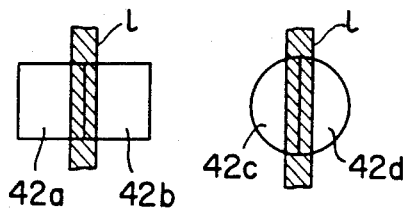
FIG. 34(b)
FIG. 34(c)
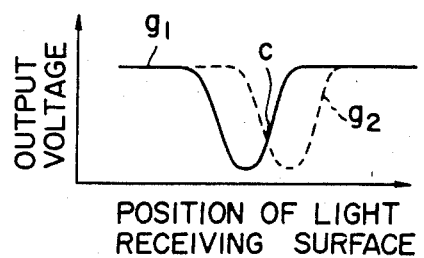
FIG. 36
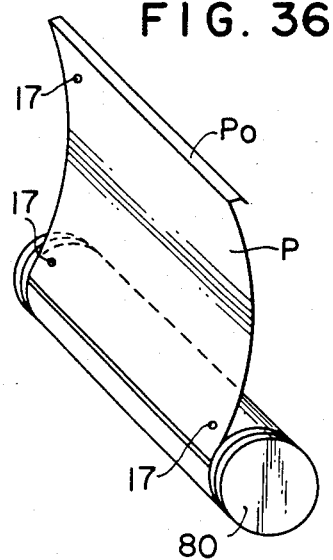
FIG. 35
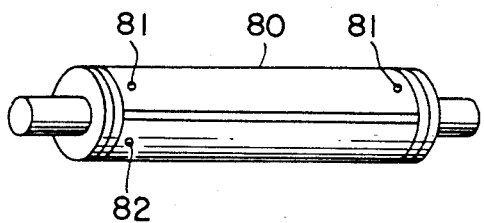
FIG. 37(a)
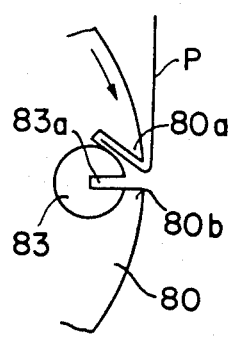
FIG. 37(b)
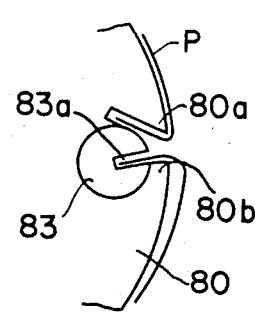
FIG. 37(c)
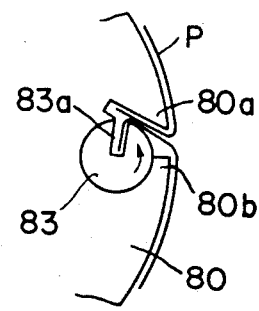

SYSTEM AND PLATE BENDING MACHINE FOR REGISTERING IN AN OFFSET PRINTING PRESS

This is a division of application Ser. No. 434,241 filed Oct. 14, 1982, now U.S. Pat. No. 4,489,652.

BACKGROUND OF THE INVENTION

This invention relates generally to offset printing and more particularly to a method and system for registering in an offset printing press and to a plate bending machine for efficiently practicing the registering method.

Heretofore, there have been various methods for registering in web offset printing presses or sheet-fed offset printing presses. In general, however, registering being carried out consistently from the reproduction process step, through the step of making the printing plate and the plate bending step, to the plate mounting step by the so-called pin hole datum or reference method wherein pin holes formed in the printing plate are used as datum references.

More specifically, the steps of forming pin holes, in a printing plate, to be datum references for mounting the plate on a plate cylinder, of bending opposite sides of the printing plate, and of forming register marks for registering on the plate have been carried out with pin holes formed in corner parts of the printing plate as datum references.

By a method wherein all process steps are carried out in this manner with pin holes as datum reference, registering is not necessarily correct when the printing plate is mounted on a plate cylinder of the printing press because of "play" and/or "wear of the pin holes". This deviation is of a magnitude exceeding the limits within which it can be rectified in the printing press in many cases, whereby automatic correction has been impossible in actual practice. The reason for this is that, in addition to the positioning in the rotational direction and the lateral direction of a printing plate, registering involves the factor of twist which means the plate is mounted obliquely on the plate cylinder.

More specifically, deviations in the rotational direction and the lateral direction of the plate can be automatically corrected within a relatively wide range of the order of ±2 mm, but the twist can be corrected only within ±0.3 mm because of mechanical restrictions. When there is an error in the mounting of the plate exceeding these limits, it becomes necessary to remount the plate on the plate cylinder after rebending end portions of the printing plate.

SUMMARY OF THE INVENTION

In view of the above described problems, it is an object of this invention to provide a method of registering in an offset printing press by which method registering for mounting of printing plates on plate cylinders can be carried out accurately and positively, with the magnitude of twist of plates held at a small value within, for example, ±0.3 mm, between the multicolor stages of the offset printing press from the very start of the printing operation.

It is another object of the invention to provide a plate bending machine by which the registering method of this invention can be practiced.

According to this invention in one aspect thereof, briefly summarized, there is provided a method for registering in an offset printing press for which printing plates of a number corresponding to the number of colors to be printed have been prepared, said method comprising, with respect to each printing plate: mounting the printing plate on a shiftable table of a plate bending machine; detecting datum time lines, which have been inscribed on said plate, by means of optical sensors mounted on the plate bending machine; shifting the shiftable table, in response to the results of the detection thus carried out, so that said datum time lines are placed at specific positions; inscribing, by means of a register mark inscribing device, register marks for carrying out automatic registering on a printing press with said datum fine lines as datum references while, at the same time, bending the two edges of the printing plate, said edges extending in the rotational direction of said plate; thereafter mounting the printing plate on a corresponding plate cylinder of the printing press; reading said register marks by means of optical means with the register marks as datum references; and carrying out automatic registering relative to the rotational and lateral directions and twist of the printing plate in response to the results of said reading.

According to this invention in another aspect thereof, briefly summarized, there is provided a plate bending machine for bending the edges of printing plates for use in an offset printing press, said machine comprising: a machine bed; plate bending mechanisms supported on opposite sides of the machine bed; a shiftable table mounted on the machine bed between the bending mechanisms in a manner whereby said table can be shifted freely in any horizontal direction and functioning to securely hold a sensitized plate mounted thereon; optical detection sensors disposed above the shiftable table and operating to detect datum fine lines inscribed on said printing plate thus held and thereby to generate signals for causing the shiftable table to shift to a specific position; a driving system for operating in response to said signals to thus cause the shiftable table to shift to said specific position; and register mark inscribing devices for inscribing register marks on said printing plate thus held on said shiftable table in said specific position.

The nature, utility, and further features of this invention will be more clearly apparent from the following detailed description with respect to preferred embodiments of the invention when read in connection with the accompanying drawings, briefly described below.

BRIEF DESCRIPTION OF THE DRAWINGS

In the drawings:

FIG. 26a is a plan view indicating other dispositions of detecting elements,

FIGS. 26b and 26c are plan views for a description of detection states of detecting elements arranged as shown in FIG. 26a;

FIGS. 34a and 34b are plan views and FIG. 34c is a graph for an explanation of the principle of detection of a sensor;

FIG. 35 is a perspective view of a plate cylinder;

FIG. 36 is a perspective view showing the initial part of the mounting of a printing plate on the plate cylinder;

FIGS. 37a, 37b, and 37c are relatively enlarged end views respectively showing steps in the mounting of the plate on the plate cylinder;

DETAILED DESCRIPTION OF THE INVENTION

Figure 1:
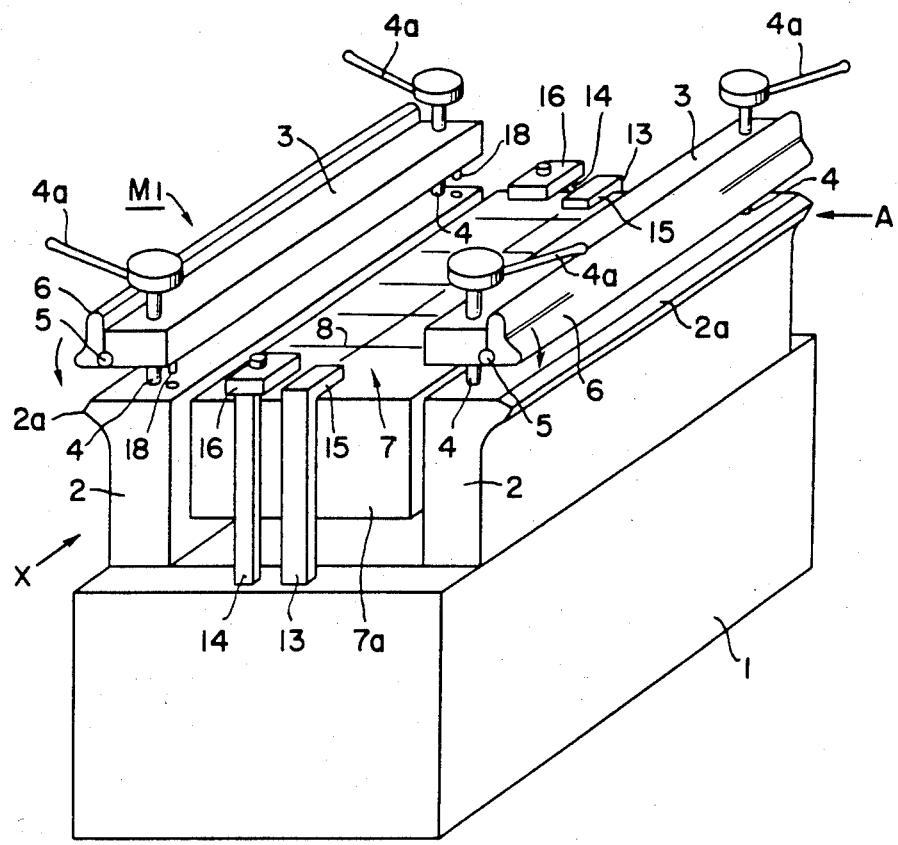
FIG. 1 is a perspective view of one example of a plate bending machine for practicing the method of this invention.

Referring first to FIGS. 1 through 4, there is illustrated therein a plate bending machine $M_1$ for bending the opposite end edges as considered in the circumferential direction of a printing plate P, that is, the edges parallel to the axis of the plate cylinder, for practicing the method of this invention. This plate bending machine $M_1$ has a machine bed 1, on which, on opposite sides thereof, bending die supports 2,2 are fixedly mounted. Bending dies 2a,2a are formed along the upper outer edges of the bending die supports 2,2.

Above the two bending die supports 2,2 and respectively parallel thereto are provided respective clamping heads 3,3 which are supported on the die supports 2,2 by screw shafts 4,4, . . . 4 provided with turning handles 4a,4a, . . . 4a. By turning the screw shafts 4,4, . . . 4, the clamping heads 3,3 can be lowered or raised to clamp or release the lateral end edges of a sensitized plate placed between the clamping heads and the die supports. Bending heads 6,6 are rockably supported by horizontal shafts 5,5 respective along the lower outer edges of the clamping heads 3,3. By causing these bending heads 6,6 to rotate downward, the end edges of a printing plate P clamped between the clamping heads 3,3 and the die supports 2,2 are pressed against the dies 2a,2a, and thus plate bending is accomplished.

Between the bending die supports 2,2, a shiftable table 7 for positioning the printing plate P is provided with its upper surface lying in the same plane as the upper surfaces of the die supports 2,2. This shiftable table 7 is adapted to be freely shiftable in all directions in a horizontal plane. Slits 8 are formed in a grid state in the upper surface of this shiftable table 7 and are connected to a vacuum source. When a printing plate P is inserted in the right-left direction as viewed in FIG. 1 through the space between a bending die 2a and its corresponding clamping head 3 and placed on the shiftable table 7, and a vacuum is applied through the slits 8, the printing plate P is drawn against the shiftable table 7 and is thus firmly held.

The shiftable table 7 rests on and is supported horizontally on four balls 9a,9a, . . . 9a rotatably supported in turn in sockets on the upper parts of respective ball supports 9,9, . . . 9. This shiftable table 7 is provided along two adjacent edges thereof with vertical side walls 7a,7a perpendicular to each other, which are caused by respective springs 11,11, . . . 11 to be in pressing contact with the tips of driving rods 10a,10b, and 10c. These driving rods 10a,10b, and 10c are supported horizontally by respective support posts 12,12,12 in a manner permitting their free movement in their axial directions. The driving rods $10a$, $10b$, and $10c$ are coupled to respective driving motors (not shown) by which they are driven to thus move in their axial directions and thereby to shift in any direction in a horizontal plane the shiftable table 7 resting on the balls $9a, 9a, \ldots 9a$.

Figure 5:
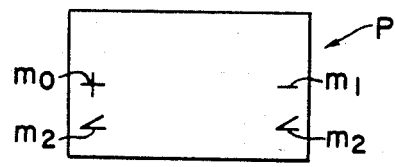
FIG. 5 is a plan view of a printing plate with register marks.

At positions slight apart from the front and rear ends of the shiftable table 7 as viewed in the direction parallel to the clamping heads, or as viewed in FIG. 1, support posts 13,13 are respectively fixed at their lower base ends to the upper part of the machine bed 1 and, at their upper ends, support respective first register mark detection sensors 15,15 for detecting the positions of first register marks $m_0$ and $m_1$ constituting reference or datum fine lines inscribed on each printing plate P as shown in FIG. 5. In the vicinity of these sensors 15,15, second register mark inscribing heads 16,16 for inscribing second register marks $m_2$, $m_2$ on the printing plate P are respectively mounted on the upper ends of respective support posts 14,14 fixed at their lower base ends to the machine bed 1.

Figure 2:
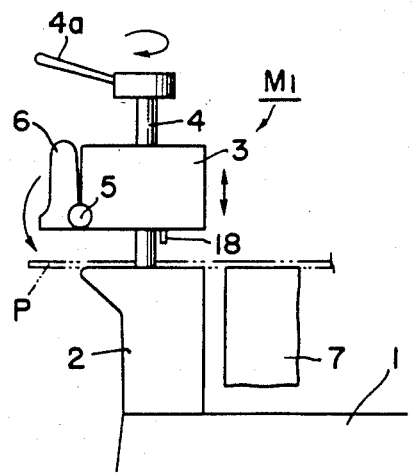
FIG. 2 is a partial elevation as viewed in the direction of arrow X in FIG. 1.
Figure 3:
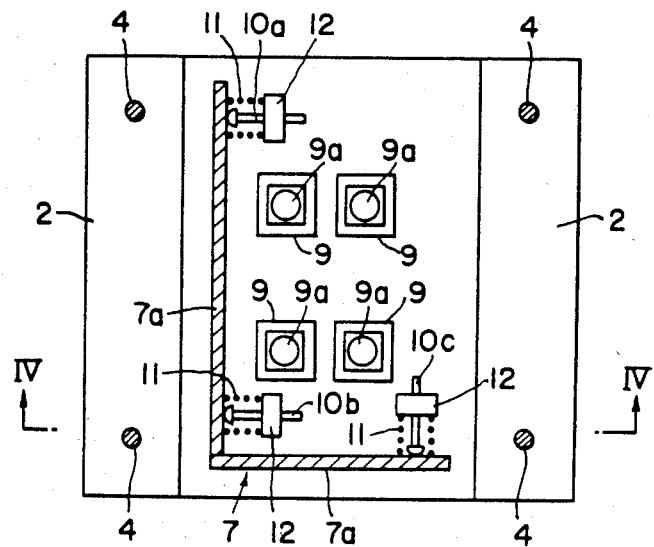
FIG. 3 is a plan view, partly in horizontal section, of the plate bending machine, showing particularly the essential parts for supporting and shifting a shiftable table.
Figure 4:
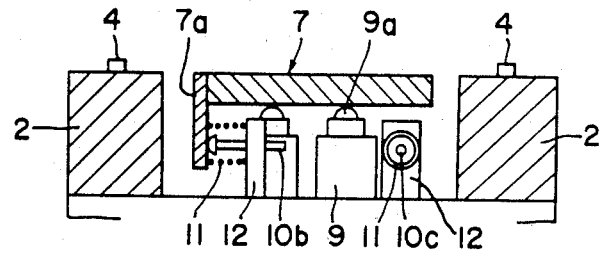
FIG. 4 is a section taken along the plane indicated by line IV—IV in FIG. 3 as viewed in the arrow direction.
Figure 9:
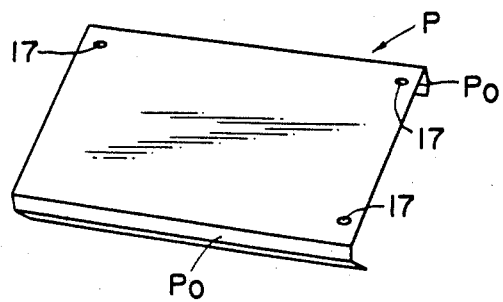
FIG. 9 is a perspective view of a printing plate after it has undergone plate bending.

As shown in FIG. 9, bent parts $P_0, P_0$ are formed along the opposite end edges of the printing plate P as viewed in the front-to-rear direction thereof, that is, along the left-to-right edges thereof. The printing plate P is also provided with punched alignment pin holes 17,17,17 for positioning at the time of mounting of the plate P onto a plate cylinder. These pin holes 17,17,17 are punched out by pin hole punchers 18 secured to the lower faces of the clamping heads 3,3 as shown in FIGS. 1 and 2.

Figure 6:
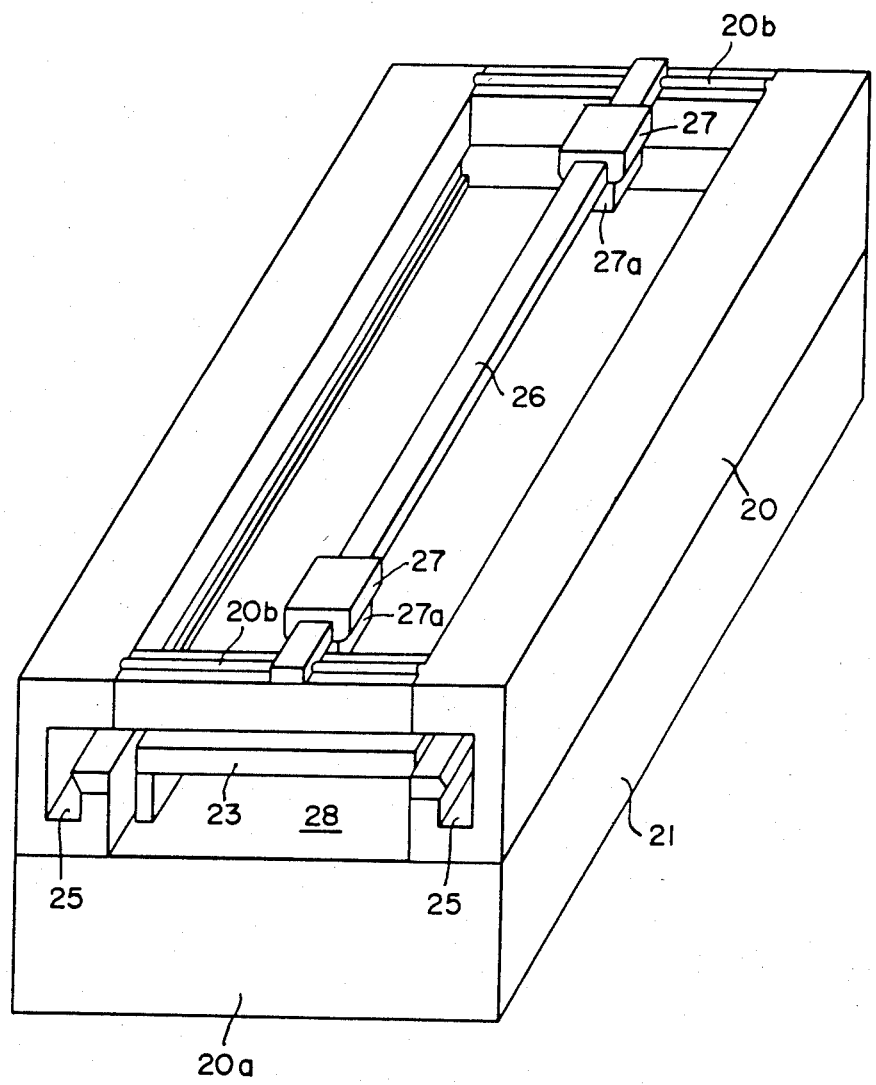
FIG. 6 is a perspective view of another example of a plate bending machine.
Figure 7:
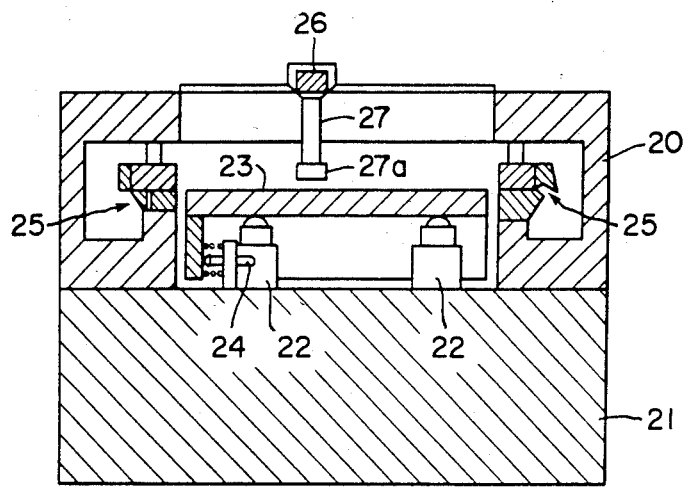
FIG. 7 is an elevation in vertical section taken in a plane extending in the left-right direction in FIG. 6 of the same plate bending machine.
Figure 8:
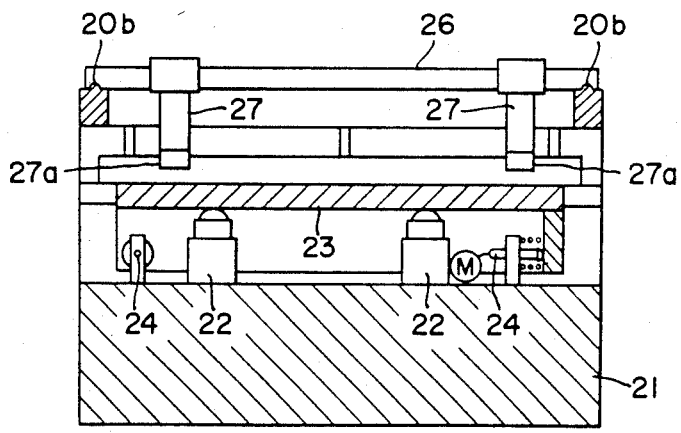
FIG. 8 is an elevation in vertical section taken in a plane orthogonal to that of FIG. 7.

Furthermore, for alignment with the positions of the first and second register marks, it is convenient to cause detecting-inscribing units each comprising an integral combination of a first register mark detecting sensor and a second register mark inscribing head as shown in FIGS. 6, 7, and 8 to shift to any desired positions.

More specifically, the plate bending machine $M_2$ illustrated in FIGS. 6, 7, and 8 has a casing 20, within which a machine bed 21 is provided. On the machine bed 21, ball supports 22, 22 similar to the ball supports 9 of the aforedescribed plate bending machine $M_1$ are fixedly mounted and support respective balls, on which a shiftable table 23 is supported in a manner permitting it to be shifted in any direction in the horizontal plane. This shiftable table 23 is adjustably shiftable by driving rods 24,24, ... 24 similar to the driving rods 10 of the preceding example. Bending mechanisms 25,25 similar to those of the preceding example are provided outside of and parallel to the left and right sides (as viewed in FIGS. 6 and 7) of the shiftable table 23.

Transverse guide rails $20b, 20b$ are secured to the upper parts of the front and rear walls (as viewed in FIG. 6) of the casing 20. The front and rear ends of a slide bar 26 are slidably engaged respectively with the guide rails $20b, 20b$. Two detecting-inscribing units 27,27 are slidably mounted on the slide bar 26 and thus can slide therealong in the front-rear direction. Each of these detecting-inscribing units has a downwardly extending part, at the lower end of which is mounted a sensor-inscribing head $27a$ accommodating a detecting sensor for carrying out detection of a first register mark and an automatic inscriber for inscribing a second register mark. Each sensor-inscribing head $27a$ is positioned to confront a printing plate P laid on the shiftable table 23.

Thus, each sensor-inscribing head $27a$ can be moved freely in a horizontal plane and can detect the position of any first register mark on a printing plate P laid on the shiftable table 23 and, in addition, inscribe a second register mark on any position on the printing plate P.

The front side wall $20a$ of the casing 20 is provided with an opening 28 through which a printing plate P can be inserted and extracted.

Referring again to FIG. 1, in the case of the plate bending machine $M_1$ shown therein, a printing plate P is inserted from the right-hand side toward the left-hand side as indicated by the arrow A through the gap between the bending die $2a$ and the clamping head 3 on the right side of the machine $M_1$ and is laid on the shiftable table 7. When the printing plate has been thus placed in its approximate position, vacuum is applied by the aforementioned vacuum source via the slits 8 thereby to cause the printing plate to be drawn against and fixed to the shiftable table 7. Then, prior to the plate bending step, the first register marks $m_0$ and $m_1$ (FIG. 5) formed on the printing plate P in the vicinity of its opposite ends in its lateral direction (not its rotational direction) are positioned approximately below their corresponding first register mark detection sensors 15,15.

These detection sensors 15,15 are optical sensors. The first register mark $m_0$ formed on one side of the printing plate P is a cross or plus (+) mark, while the first register mark $m_1$ on the other side is a minus (—) mark. For this reason, two sensors $15a$ and $15b$ are provided for detecting the two intersecting fine lines $l_0$ and $l_1$ of the plus mark $m_0$, and a sensor $15c$ is provided for detecting the fine line $l_2$ of the minus mark $m_1$ as indicated in FIGS. $10a$ and $10b$. For accurate positioning or registering of the printing plate P on the shiftable table 7, the shiftable table 7 is so shifted that the lines $l_0$, $l_1$, and $l_2$ of the first register marks become coincident with the center positions of the sensors $15a, 15b$, and $15c$. This adjustment shifting is accomplished automatically by feedback control by the aforedescribed driving rods $10a$, $10b$, and $10c$ driven by driving motors (not shown) in response to detection signals indicating deviations or offsets from the detection sensors.

Figure 10:
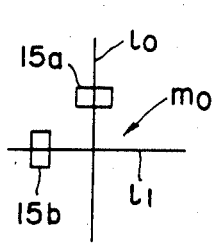
FIGS. 10a and 10b are plan views respectively indicating relationships between register marks and sensors.
Figure 10:
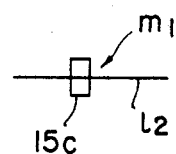
Figure 11:
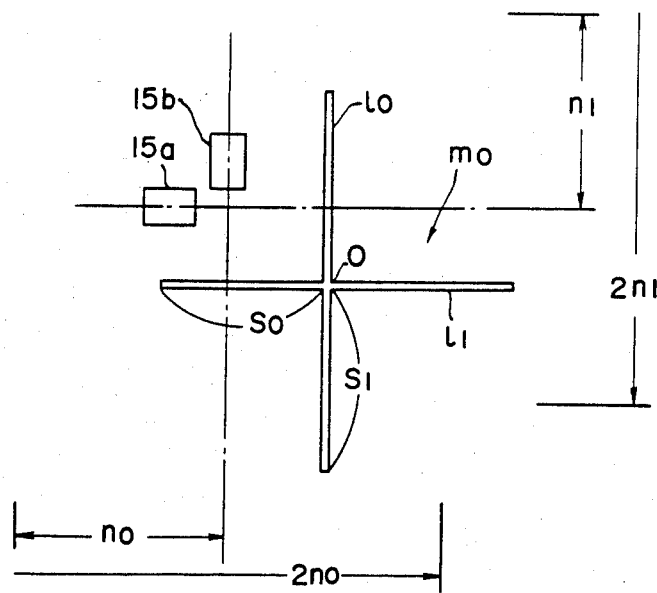
FIG. 11 is an enlarged plan view for a description of a method of registering in a plate bending machine.
Figure 12:
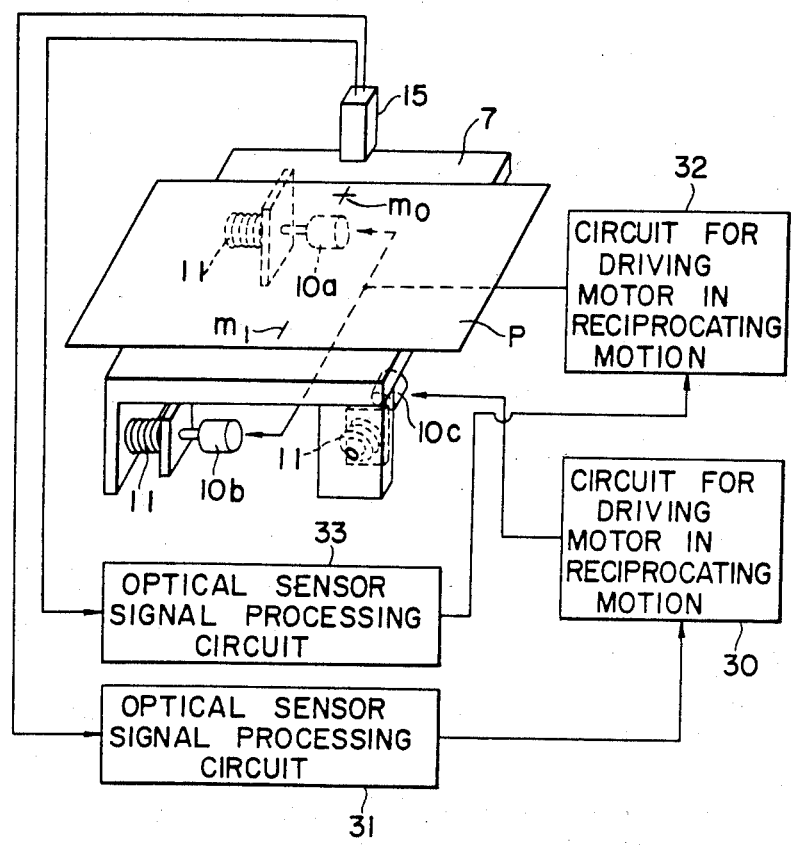
FIG. 12 is a combination of schematic perspective view and a block diagram indicating a mode of automatically controlling shifting of the shiftable table in a plate bending machine.

More specifically, in order to bring the fine line $l_0$ extending in the rotational direction (vertical direction) in FIG. 11 to the position of the sensor $15b$, the driving rod $10c$ for the lateral direction (left-right direction in FIGS. 10 and 11) is first caused to move through a distance $n_0$ in one of the lateral directions by a signal from a circuit 30 for driving in reciprocating motion a motor for lateral direction as shown in FIG. 12. If, at this stage, the fine line $l_0$ enters the field of detection of the sensor $15b$, the sensor $15b$ will detect this fine line and send a detection signal through a circuit 31 for processing optical sensor signals for lateral direction to the above mentioned driving circuit 30. Then, if the fine line $l_0$ comes into coincidence with the center of the sensor $15b$, the driving rod $10c$ for lateral direction will be stopped.

If, even when the driving rod $10c$ is moved through the distance $n_0$ in one of the lateral directions, the fine line $l_0$ does not enter the field of detection of the sensor $15b$, this means that the shiftable table 7 has been shifted in the direction to cause the fine line $l_0$ to separate away from the sensor $15b$. Accordingly, in this case the driving rod $10c$ is moved through the distance $2n_0$ in the opposite direction.

A suitable value of the initial shifting distance $n_0$ of the shiftable table 7 is from 0.3 to 15 mm. It is necessary that this distance $n_0$ be of a value less than the distance $S_0$ of extension of the cross-shaped first register mark $m_0$ in the lateral direction from its center point O and that this value be less than the distance of offset from the sensor 15b when the printing plate is mounted on the shiftable table 7. Therefore, when the offset distance is great, it is necessary to lengthen also the fine line $l_0$ of the first register mark. Since the visible offset distance is ordinarily less than 10 mm, the extension distance $S_0$ may also be approximately 10 mm.

Under the above described conditions, the fine line $l_0$ will always enter the field of detection of the sensor 15b. When the fine line $l_0$ thus enters the field of detection of the sensor 15b and becomes positioned at the center point thereof, the driving rod 10c is stopped.

Next, with the machine in this state, the adjusting operation of causing the shiftable table 7 to shift in the rotational direction (vertical direction as viewed in FIGS. 10 and 11) thereby to bring the register fine line $l_1$ for the rotational direction into the field of detection of the sensor 15 is carried out. More specifically, the driving rods 10a and 10b are caused to move through a distance $n_1$ in one direction by a circuit 32 for driving in reciprocating motion motors for rotational direction. In this case, if the fine line $l_1$ enters the field of detection of the sensor 15a, a corresponding detection signal will be sent via a circuit 33 for processing optical sensor signals for rotational direction and will enter as input the above mentioned driving circuit 32. When the fine line $l_1$ comes into the field of detection or the center position of the sensor 15a, the driving rods 10a and 10b are stopped. If, even when the shiftable table 7 is shifted through the distance $n_1$, the sensor 15a does not detect the fine line $l_1$, the shiftable table 7 is shifted by the distance $2n_1$ in the opposite direction similarly as in the above described registering procedure.

The shifting distance $n_0$ for the lateral direction and the shifting distance $n_1$ for the rotational direction may be set at equal values. In conformance with this, the lengths of the two fine lines $l_0$ and $l_1$, that is, the lengths of the extension distances $S_0$ and $S_1$ thereof from the intersection point thereof, may be made euqal.

Furthermore, while the registering in the lateral direction was carried out first in the instant example, it will be obvious that the registering in the rotational direction may be done first.

Then, in the case where, after the plus mark $m_0$ has entered the fields of detection of the sensors 15a and 15b in the above described manner, the minus mark $m_1$ is offset from the field of the sensor 15c, the following operation is carried out.

Figure 13:
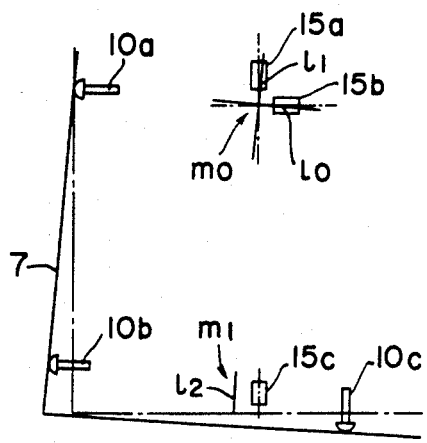
FIG. 13 is a diagrammatic plan view for a description of a mode of correcting twist.

The state wherein the plus mark $m_0$ has entered the fields of detection, but the minus mark $m_1$ is not within the field of detection of the sensor 15c means that the setting of the printing plate P has been left with a twist. In this case, as indicated in FIG. 13, by causing the driving rods 10b and 10c to advance or retract in the same direction while the driving rod 10a positioned at one end of the shiftable table 7 is feld fixed, the shiftable table 7 is brought from the solid-line position in FIG. 13 to the position indicated by the single dot chain line. The quantity of shift of the plus mark $m_0$ at this time is made small, and, within a range wherein the mark does not depart from the fields of detection of the sensors, the minus mark $m_1$ is swung in the rotational direction. In this case, also, this swinging is carried out through shift distances of $+n$ and $-2n$ thereby to bring the mark within the field of detection.

By this procedure, all of the fine lines are brought into the fields of detection of the sensors 15a, 15b, and 15c. However, since this twist correction causes the fine lines $l_0$ and $l_1$ to become offset from the centers of the sensors 15a and 15b, it is necessary to carry out a final positioning of the printing plate P for causing the fine lines $l_0$, $l_1$, and $l_2$ to coincide with the centers of the sensor as described below.

First, the driving rods are so moved as to bring the fine line $l_1$ of the plus mark $m_0$ and the minus mark $m_1$ to the centers of the sensors 15a and 15c thereby to carry out twist correction and parallel correction as described above and carry out positioning in the rotational direction. With the machine in this condition, the driving rods 10a and 10b are fixed.

Then, only the driving rod 10c is moved so as to bring the fine line $l_0$ of the plus mark $m_0$ to the center of the sensor 15b thereby to accomplish lateral positioning. In this manner, accurate and positive positioning of the printing plate P is carried out.

This positioning method can be utilized not only in the positioning of a printing plate P but also in a device for determining the position where a film original is to be bonded. In addition, this method can be utilized as an initial position setting method for all devices using a positioning method depending on differential outputs of divided type sensors.

In general, presensitized plates (PS plates) are used in offset printing. As is known, the non-image area in which printing elements do not exist is constituted by an aluminum surface which has been grained, while the image area containing printing elements is constituted by a lipophilic photosensitive resin.

Figure 14:
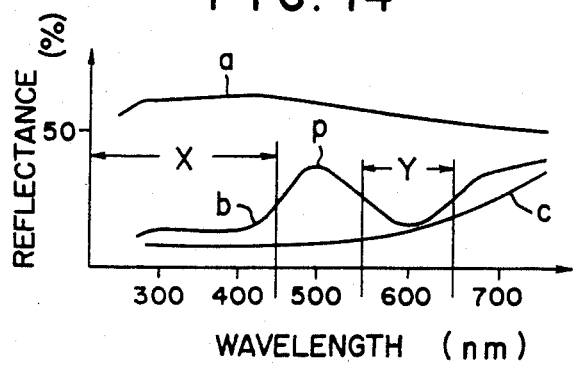
FIG. 14 is a graph indicating the variation of reflectance with wavelength of an image area and a nonimage area.

For optically detecting a datum fine line on a sensitized plate by means of a detection sensor, it is necessary that the contrast of the fine line parts be distinct. Accordingly, when the spectral reflectance of a printing plate P is measured, the reflectances of the image area and the non-image area at different wavelengths of the light source are found to be as indicated in FIG. 14.

More specifically, the reflectance of the non-image area (aluminum surface) does not fluctuate very much with variation of the light-source wavelength as indicated by curve a. However, the reflectance of the image area after development, as indicated by curve b, has a peak, and the reflectance of the image area of the sensitized plate which has undergone burning-in treatment, as indicated by curve c, increases progressively as the wavelength increases.

Among PS plates, there are those of the positive type in which the photosensitive resin of the image area is disintegrated by light and those of the negative type in which it is hardened by light. The type under discussion herein is the positive type.

A wavelength corresponding to portions wherein the contrast between the image area and the non-image area of the curves great becomes the wavelength which should be used. However, the range of the photosensitive wavelength of the photosensitive resin of a PS plate is, in the case wherein burning-in treatment has not been conducted, in general, from 270 to 470 (X range). In the case of a positive type PS plate, when it is again irradiated by light of the above mentioned wavelength after exposure to light and development, the photosensitive resin of the image area is sensitized by the light and decomposes, whereby wavelengths in this range are undesirable.

The treatment referred to as burning-in is a high-temperature heating treatment which is carried out after development for the purpose of increasing the printing durability (Druckwiderstandsfähigkeit) of the PS plate print. By this treatment the image area resin of the PS plate loses its photosensitivity, and therefore, for a PS plate which has undergone burning-in treatment, a wavelength of X range can be used. In general, however, not all PS plates are subjected to burning-in, there being many which are mounted on a printing press in their unburned-in state. With respect to these PS plates, irradiation with light of the aforementioned photosensitive wavelength range is harmful.

Furthermore, the peak portion of the curve b in FIG. 14 is undesirable because of small contrast relative to the non-image area. Accordingly, irrespective of whether or not the PS plate has undergone burning-in, the wavelength at which the greatest contrast can be obtained between the image area and the non-image area is in the range of 550 to 650 nm (Y range). Moreover, when this wavelength is used, even if a PS plate which has not yet undergone burning-in is irradiated, the photosensitive resin will not decompose, which is a safe feature.

In view of the above described circumstances, it is necessary to use light of a wavelength of 550 to 660 nm for optically detecting fine lines on a printing plate P. Light of this wavelength can be applied also to negative type PS plates.

Figure 15:
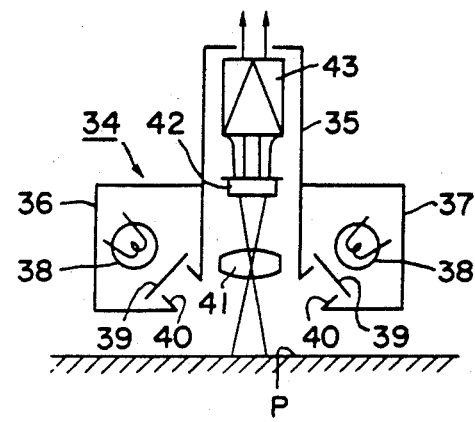
FIG. 15 is a schematic diagram showing the essential parts of one example of a fine line detection device of the machine of this invention.

Each of the aforedescribed detection sensors 15 and the detection sensors of the detecting-inscribing units 27 have a casing 34 as indicated in FIG. 15. This casing comprises a vertical cylinder 35 disposed at its center and extending centrally in the direction away from the printing plate P (upward as viewed in FIG. 15) and left and right housings 36 and 37 connected to the vertical cylinder 35 on opposite sides thereof and projecting sidewise and outward therefrom. These housings 36 and 37 respectively accommodate white light sources 38, 38 for projecting white light onto the printing plate P in left-and-right symmetrical dispositions. In the projecting light paths from these white light sources 38, 38, and also within the housings 36 and 37, optical filters 39,39 are provided.

The light from each white light source 38 passes through the respective filter 39 and a projection opening 40 in the housing and is projected onto a fine line on the surface of the printing plate P. The reflected light reflected from the surface of the plate P passes through a lens system 41 disposed at the lower part of the vertical cylinder 35 and reaches a light-receiving element 42 positioned above the lens system 41. This light-receving element 42 operates in response to the light thus reaching it to generate a faint corresponding signal. An amplifier 43 is connected to the upper part of the element 42 and operates to amplify and transmit the faint signal from the element 42 in a manner to eliminate the effect of outside noise.

For the white light sources 38, 38, various kinds of incandescent lamps, fluorescent lamps, xenon lamps, and others can be used. While a single lamp may be used, a plurality of lamps may be used to eliminate unbalance. Furthermore, lens systems may be installed in front of (downstream from) the light sources to obtain illumination by condensing the light from the light sources.

For the optical filters 39,39 filters commonly called sharp-cut filters for general photographic use, particularly filters Y-48, Y-50, Y-52, O-54, and O-56 among those specified in Japanese Industrial Standards, designation JIS B 7113, "Glass filters (sharp-cut) for photographic use", and filters possessing like characteristics, may be used. Furthermore, instead of using filters 39,39, the light emitting lamp of the light source may be colored so that light of wavelengths below 480 nm will not be emitted from the white light source, or a light source which will not generate light of wavelengths below 480 nm may be used as the light source itself.

For the light-receiving element 42, an element having a peak of light-receiving sensitivity in a wavelength range of 550 to 650 nm and a sensitivity which becomes 1/10 or less of the peak value at wavelength above 700 nm is used. For example, a gallium-arsenic photodiode or phototransistor can be used.

For the lens system 41, a system which is capable of imaging the fine-line real image on the sensitized plate P on the light receiving surface of the light-receiving element 42 is used and may be a single convex lens but may comprise a plurality of lenses for correction of aberrations.

The registering precision can be improved by providing in side-by-side disposition two light-receiving surfaces 42a,42b in the aforedescribed light-receiving element 42 shown in FIG. 15, forming on these light-receiving surfaces an image of a register mark on the printing plate P optically projected by the optical system, and detecting the position of the fine line 1 of the register mark from the balancing of the light quantities received by the two light-receiving surfaces 42a,42b as shown in FIG. 34. More specifically, in FIG. 34c, the variation of output voltage of the light-receiving surface 42a with the position of the fine line 1 is indicated by the solid-line curve $g_1$, while that of the light-receiving surface 42b with position of the fine line 1 is indicated by intermittent-line curve $g_2$. The intersection C of these two curves $g_1$ and $g_2$ corresponds to the center position of the fine line 1. The light-receiving surfaces may be of semicircular shape as denoted by 42c and 42d in FIG. 34b, these two surfaces being disposed to form a circle. That is, the light-receiving surfaces may be of any shape as long as they are symmetrical with respect to the boundary line dividing them into two parts.

Figure 16:
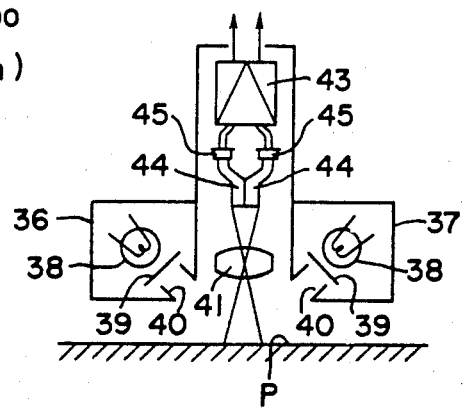
FIG. 16 is a schematic diagram showing another example of a fine line detection device of the invention.

Instead of using for the light-receiving element 42, light-receiving means of the above described construction wherein the light-receiving surface is divided by a straight line, an arrangement as shown in FIG. 16 wherein optical-fiber bundles 44,44 are disposed side-by-side with end surraces on which register fine lines are imaged, and light-receiving elements 45,45 are connected respectively to the opposite ends of these optical-fiber bundles 44,44, may be used.

By the use of a detection sensor as described above, positional detection of high precision can be carried out in a stable manner irrespective of whether or not the PS plate has undergone burning-in, whereby this detection sensor is optional for use in a system for the aforementioned second registering. While this detection sensor has been designed for reading fine lines on PS plates, it can be used as it is for other purposes. For example, it can be used for detecting the black image of a film original by a reflection method by laying a white sheet below a transmissive film and also for detecting fine lines for positioning such articles as a print substrate or a semiconductor wafer.

The principle of this detection sensor is based on the fact that the light reflectance of the photosensitive resin layer of the fine line area, that is, the image area, differs from that of the surrounding aluminum grained surface. When a first register line, which is a datum fine line is being detected, fine line detection is possible if the line within the detection area is either only a first register print element or only a scribed mark-off line. In actual practice, however, since a mark-off line exists at one portion in first register print elements, the mark-off line influences the optical detection.

Figure 17:
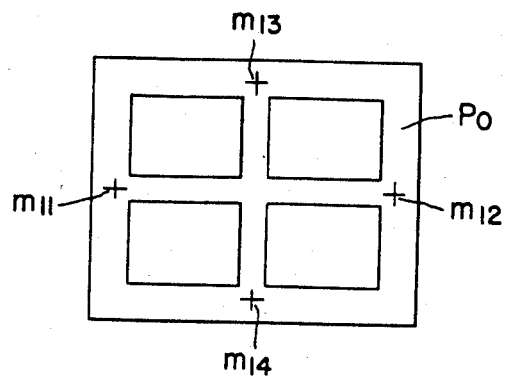
FIG. 17 is a plan view of a film original to be used in the making of a sensitized plate.
Figure 18:
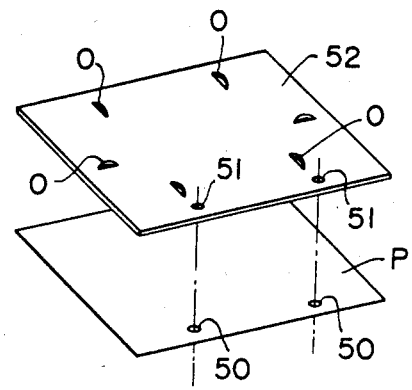
FIG. 18a is a perspective view showing a mark-off (scribing) sheet and a sensitized plate both with mutually corresponding pin holes.
FIG. 18b is a plan view of a sensitized plate with pin holes and scribed lines.
FIG. 18c is a plan view indicating the manner in which photoprinting is carried out with a film original on a sensitized plate.
Figure 18:
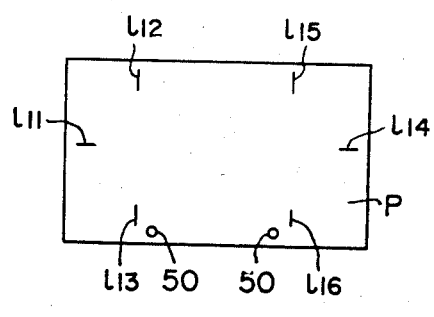
Figure 18:
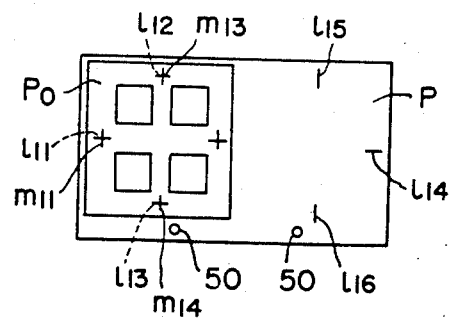

More specifically, on a transparent film original $P_0$, in general, datum fine lines called first register marks $m_{11}$, $m_{12}$, ... $m_{14}$ for registering of various color patterns at the time of multicolor printing are formed in addition to the basic pattern as shown in FIG. 17. In the case of four-color printing, the color copies are color separated into yellow, red, indigo, and black. For this purpose, four film originals $P_0$, each as shown in FIG. 17, are fabricated respectively for yellow, red, indigo, and black. The patterns of these film originals $P_0$ are photoprinted separately on respective sensitized plates P as indicated in FIG. 18. In order to carry out correctly second registering of all colors in multicolor printing, it is necessary that photoprinting of all film originals $P_0$ be accomplished on their respective sensitized plates at the same position.

In the printing process in which a plurality of different film originals $P_0$ are photoprinted on a single PS plate (sensitized plate), on a required number of sensitized plates P having pin holes 50,50, a mark-off sheet 52 having pin holes 51,51 at the same positions as the pin holes 50,50 is superimposed, and mark-off (scribed) lines $l_{11}$, $l_{12}$, ... $l_{16}$ are scribed along mark-off (scribing) windows formed in the mark-off sheet 52. These mark-off lines $l_{11}$, $l_{12}$, ... $l_{16}$ are marks for indicating the photoprinting position of the film original $P_0$ relative to the sensitized plate P.

The photoprinting of the film original $P_0$ is carried out, as indicated in FIG. 18c, by bringing the lines of the register marks $m_{11}$, $m_{13}$, and $m_{14}$ of the film original $P_0$ accurately into coincidence with the scribed lines $l_{11}$, $l_{12}$, and $l_{13}$, respectively, of the sensitized plate P. The right side (as viewed in FIG. 18c) of the sensitized plate P is photoprinted in the same manner. In the example of FIG. 18, the case of two-face photoprinting wherein photoprinting is carried out on two portions of a single sensitized plate P is illustrated. As described above, in four-color printing, patterns and register marks of respective film originals are photoprinted on a common position on four sensitized plates.

Since the scribed lines $l_{11}$, $l_{12}$, ... $l_{16}$ of the plate surface are formed by means of a scribing stylus, the photosensitive resin layer on the sensitized plate is scraped off, leaving the surface of the aluminum exposed. For this reason, the second register marks photoprinted in surperposed state on the scribed lines cannot form an image in these parts on the plate surface, and the image lines and the scribed lines are in a mixed state.

Figure 19:
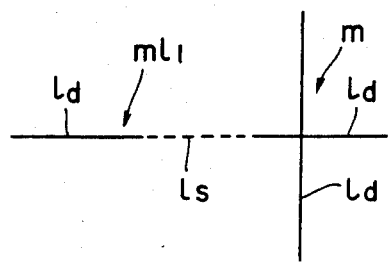
FIG. 19 is plan view indicating a state of a register mark.
Figure 20:
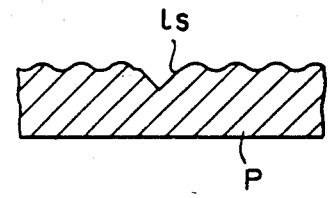
FIG. 20 is an enlarged fragmentary sectional view of a printing plate at a part thereof of a scribed line of a register mark.
Figure 21:
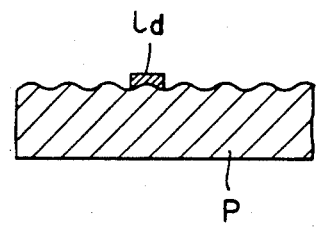
FIG. 21 is a view similar to FIG. 20 showing the plate at a part thereof of an image line part of a register mark.

This state is illustrated in FIG. 19, in which a cribed line $l_s$ as shown in FIG. 20 is mixed with one portion of a lateral register line $ml_1$ of a second register mark m. At other portions, register lines $l_d$ (image area) as shown in FIG. 21 are formed. The length of the scribed line $l_s$ is ordinarily 3 mm to 6 mm, while the length of the lateral register line $ml_1$ is ordinarily of the order of 20 mm. Therefore, there is no possibility of the scribed line $l_s$ becoming longer than the register line $ml_1$.

In the case where a lateral register line $ml_1$ into which as scried line $l_s$ has entered in this manner is being detected by means of a sensor as described above, fine line detection is possible if the line within the detection area is only the register image line $l_d$ or only the scribed line $l_s$. In general, however, the image line $l_d$ has a low reflectance from the aluminum grained surface, whereas the scribed line $l_s$ is the bare aluminum surface and therefore has a higher reflectance than the aluminum grained surface. As a consequence, as the boundary part between the image line $l_d$ of the register line and the scribed line $l_s$ enters the detection area, that is, when the image line $l_d$ and the scribed line $l_s$ become present at the same time within the detection area, the decrease in the quantity of reflected light from the image line $l_d$ is canceled by the increase in the quantity of reflected light from the scribed line $l_s$. As an undesirable result, the light quantity becomes the same as the reflected light quantity in the case where the detection area is scanning only the aluminum grained surface, and the register line cannot be detected.

Figure 22:
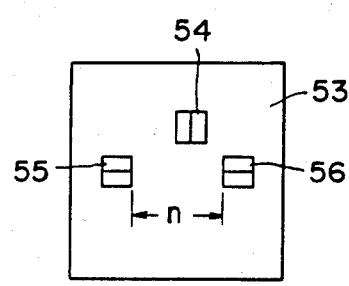
FIG. 22 is a plan view indicating dispositions of detecting elements.
Figure 23:
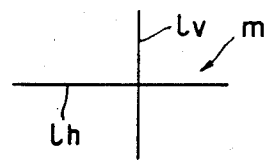
FIG. 23 is a plan view for a description of a register mark.

In order to solve this problem, a detecting element 54 for detecting the vertical register line $l_v$ of the register mark m (FIG. 23), a main detecting element 55 for detecting the horizontal register line $l_h$, and a subdetecting element 56 disposed apart from this main detecting element 55 along the horizontal register line $l_h$ and functioning to obviate detection obstruction due to the scribed line are provided on the light receiving surface of the detection sensor as shown in FIG. 22. The spacing distance n between the opposed inner edges of the main detecting element 55 and the subdetecting element 56 is set longer than or equal to the length of the scribed line. The length of the scribed line is determined by the size of the scribing window O of FIG. 18a, being ordinarily of the order of 3 mm to 6 mm. By setting the distance n at a value greater than this range, even when one end of the scribed line coincides with the main detecting element 55 to become a detection obstruction, the scribed line has not reached the subdetecting element 56, whereby correct detection of only the image line is possible.

Figure 24:
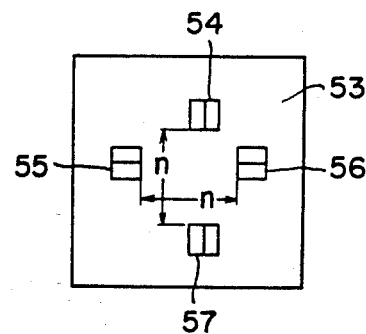
FIG. 24 is a plan view indicating other dispositions of detecting elements.

On the light receiving surface 53 shown in FIG. 22, the main detecting element 55 and the subdetecting element 56 are provided in order to detect the lateral or horizontal register line $l_h$ on the assumption that the scribed line is present on only the horizontal register line $l_h$. In the case where the scribed line is on also the vertical register line $l_v$ of the register mark m, a subdetecting element 57 for detecting the vertical register line may be provided as shown in FIG. 24 in addition to the arrangement shown in FIG. 22, and the aforementioned detecting element 54 for detecting a vertical register line may be used to function as a main detecting element for detecting the vertical register line. In this case, also, the spacing distance n between the two detecting elements 54 and 57 is made longer than or equal to the length of the scribed line.

Figure 25:
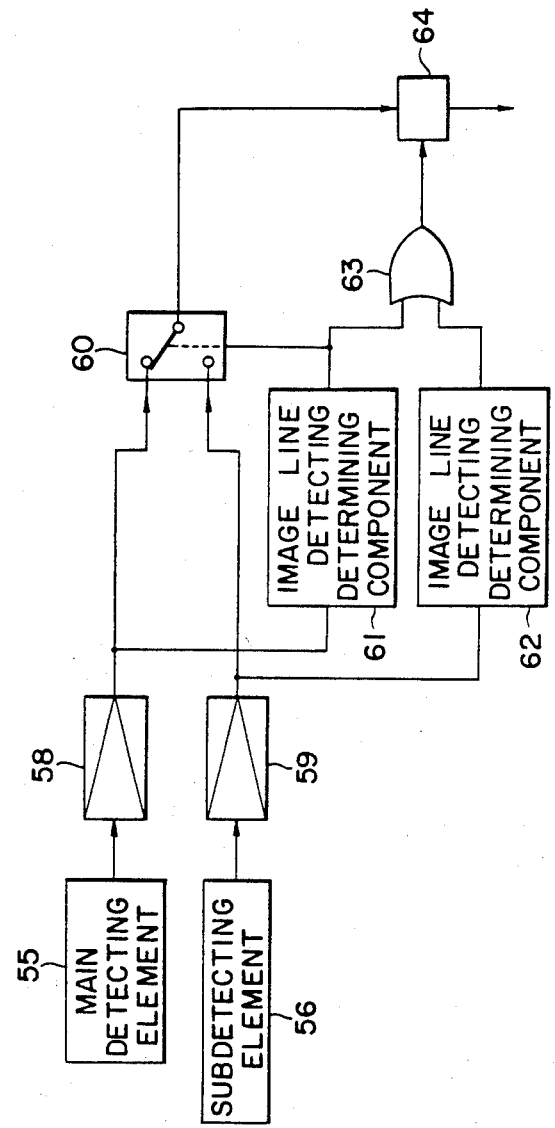
FIG. 25 is a block diagram indicating the mode of switching between main detecting and subdetecting elements.

Changing over of detecting elements in the case of detection obstruction is accomplished electrically as indicated in FIG. 25. This switching will now be described with respect to detection of a horizontal register line $l_h$. Photoelectric-converted signals from the main detecting and subdetecting elements 55 and 56 are respectively amplified by amplifiers 58 and 59 and are then transmitted to an analog switching component 60 and respectively to image line detecting/determining components 61 and 62. These image line detecting/determining components 61 and 62 thereupon operate to compare, by means of comparators, signal variations occurring during detection of image lines by the detection area thereby to determine whether or not image lines have entered the detection area.

More specifically, when an image line of a register mark and a scribed line are present in mixed state in the detection area, there are few signal variations. Accordingly, comparison is made with the datum level of the case of only the image lines or only a scribed line in the detection area thereby to determine that there is detection obstruction. In the case where a register mark has not entered the detection area and the aluminum grained surface is being detected, there is no signal variation, and therefore it is determined that an image line has not arrived.

Furthermore, by taking the logical sum of the signals from the determining components corresponding to the main detecting and subdetecting elements 55 and 56, even when the register mark is being detected simultaneously by both detecting elements 55 and 56, it is quite certain that an image line has entered the detection area since one of the detecting elements detects only the image line with which a scribed line is not in mixed state. Then the determining component 61 of the main detecting element 55 controls the analog switch 60 for switching between the main detecting and subdetecting elements, thereby automatically carrying out switching of the detecting elements. As a result, even if either one of the detecting elements is subject to detection obstruction due to the scribed line, detection of the image lines is accomplished by the detecting element not subject to that obstruction. The image line detection signal from either of the determining components 61 and 62 is led out through an OR circuit 63 to a gate circuit 64, and the detection signal which has passed through the analog switch 60 is gated in the gate circuit 64 by this signal from the OR circuit 63.

Figure 26:
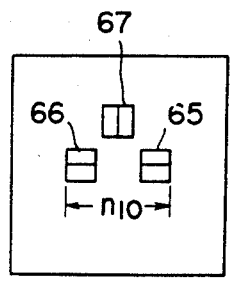
Figure 26:
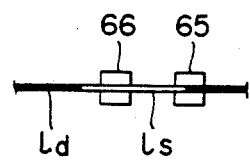
Figure 26:
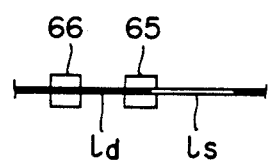

As another example of practice embodying this invention, in addition to a detecting element 67 for detecting a vertical register line, main detecting and subdetecting elements 65 and 66 may be so installed as shown in FIG. 26a that the distance $n_{10}$ between the outer edges of their detection area becomes shorter than the length of the scribed line. In this case, even when one end of the scribed line $l_s$ coincides with the main detecting element 65 as indicated in FIG. 26b to obstruct the detection of this detecting element 65, the subdetecting element 66 detects only the scribed line $l_s$. In a case as indicated in FIG. 26c, the subdetecting element 66 detects only the register line $l_s$. Thus, since one of the detecting elements detects only the register line $l_d$ or only the scribed line $l_s$, the register mark can be correctly detected. In this connection, since the scribed line $l_s$ and the register line $l_d$ lie along the same straight line as mentioned herein before, the scribed line $l_s$ may be detected instead of the register line $l_d$ with one of the detecting elements.

The switching of the main detecting and subdetecting elements when detection obstruction occurs may be carried out by a method as indicated in FIG. 25 similarly as in the preceding example of practice.

Figure 27:
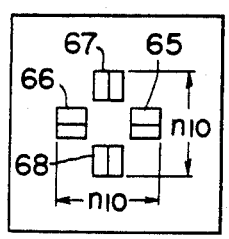
FIG. 27 is a plan view indicating still another arrangement of detecting elements.

Furthermore, in the case where a scribed line exists not only in the horizontal direction similarly as in the preceding example but also in the vertical direction, a subdetecting element 68 is provided also in the vertical direction as shown in FIG. 27, and the spacing distance $n_{10}$ between the outer edges of the detection area of the two detecting elements 67 and 68 is made shorter than the length of the scribed line.

In each of the detecting elements in the above described examples, the detection method comprises bisecting the detection area and detecting the position from the balance of the light quantities when the fine line is imaged in the left and right or upper and lower areas. However, each detecting element may be of a character whose area is not divided, and which detects each fine line from variations in the light quantity received in the single area.

By the provisions of this invention as described above, even when scribing is carried out on the printing plate P in the plate preparation process and detection obstruction due to a scribed line occurs, it becomes possible to avoid this and accomplish detection of a register mark in a stable manner. Furthermore, even when something other than a scribed line which becomes an obstruction to detection of a register mark enters the detection area simultaneously with an image line, it becomes possible to avoid the obstruction and to carry out stable detection.

In a plate bending machine as illustrated in FIGS. 6, 7, and 8, the slide bar 26 and each detecting-inscribing unit 27 must be so moved that a register mark on the printing plate P enters the detection scope of the detector (detection sensor) of the detecting-inscribing unit 27.

Figure 28:
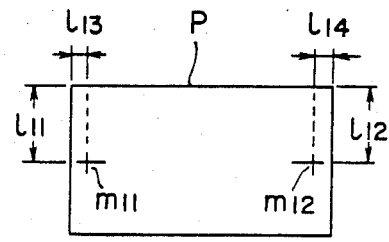
FIG. 28 is a plan view of a printing plate with cross or "plus" register marks on both lateral sides.

In general, of the plurality of register marks of a printing plate P, the register marks $m_{11}$ and $m_{12}$ at the opposite left and right ends thereof are provided at specific positions which are in the center or close to ¼ from the ends of the printing plate P with respect to the rotational direction thereof ($l_{11}=l_{12}$) as shown in FIG. 28. However, the distances ($l_{13}$ and $l_{14}$) of the register marks from the opposite ends in the lateral left and right directions differ variously in some cases ($l_{13} \neq l_{14}$) depending on the dimensions of the article to be printed. In general, plus marks are formed on the printing plate P and the minus mark on the right side of the plate in FIG. 5 is a part of the plus mark. For this reason, if the detectors are fixed in specific positions in the above mentioned plate bending machine, this will give rise to the objectionable result of the register marks not entering the detection scope of the detectors when printing plates which although being of the same plate dimensions, have different printing areas are used.

Furthermore, it is possible to manually set the detectors so that the register marks of the printing plate will enter the detection scope of the detectors. However, this is difficult because, in order to increase the detection precision of the detectors, the detection scope must be set within a narrow range which, in terms of width, is of the order to 0.2 to 2.0 mm, preferably 0.4 to 1.0 mm.

Further, there is a method wherein the positions of the register marks are memorized previsouly, and the memorized values are selected to accomplish automatic positioning. However, while the positions in the rotational direction ($l_{11}$, $l_{12}$) are limited to a few, the lateral positions ($l_{13}$, $l_{14}$) vary greatly depending on the dimensions of the article being printed. For this reason, the number of combinations of positions in the rotational and lateral directions becomes large, and the work of selection becomes disadvantageously complicated.

Still another possible method comprises imparting the positions of the register marks by information input means such as a keyboard, paper card, or magnetic card and using this information to accomplish automatic positioning of the detectors. This method, however, is disadvantageous in that such information must be imparted continually to the sensitized plates, and an additional process step becomes necessary in the plate preparation work.

Figure 29:
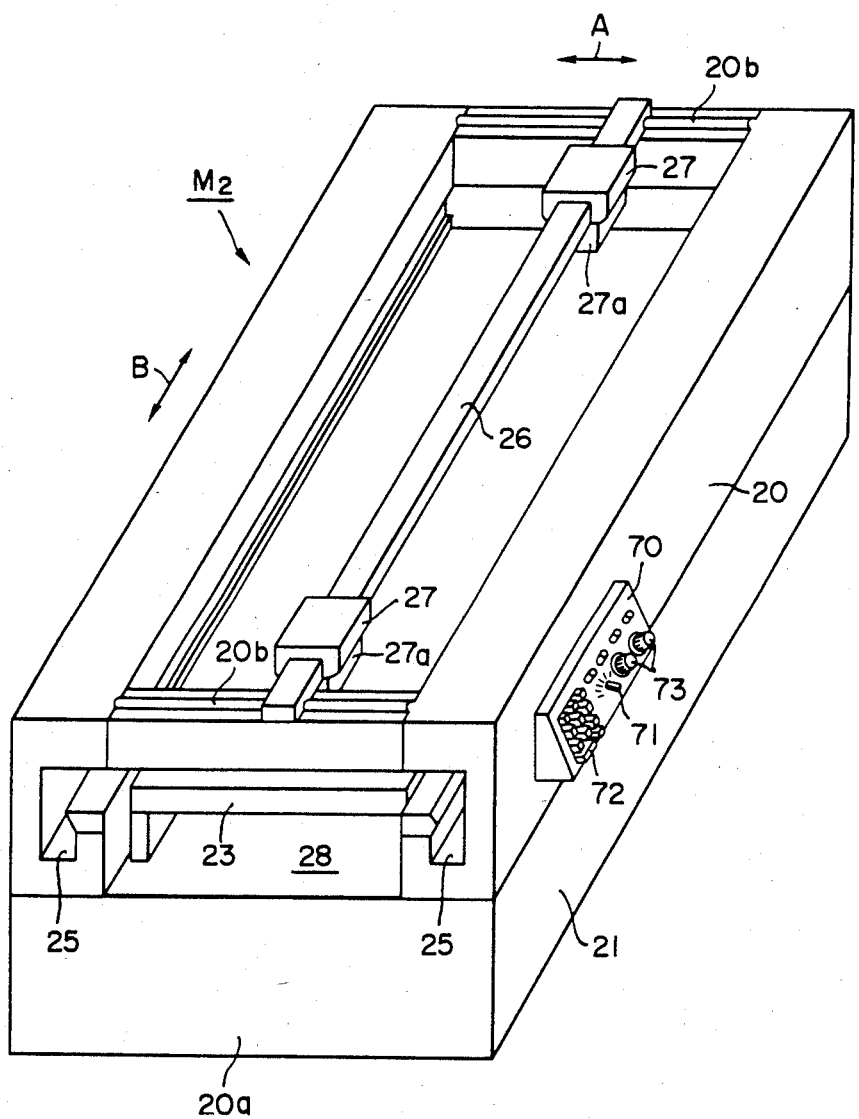
FIG. 29 is a perspective view of a plate bending machine according to this invention.

For this reason, a control panel 70 is provided on one side wall in the front-rear direction (as viewed in FIG. 29) of casing 20 of the plate bending machine $M_2$. On this control panel 70 are mounted a selection switch 71 for selecting specific stopping positions of the aforedescribed slide bar 26 in the left-right direction as indicated by arrow A, a keyboard 72 for information input for setting as input such information as the stopping position of the slide bar 26, and various switches 73 for moving and stopping mechanisms and parts such as the slide bar 26, the detecting-inscribing units 27, and the shiftable table 23.

Figure 30:
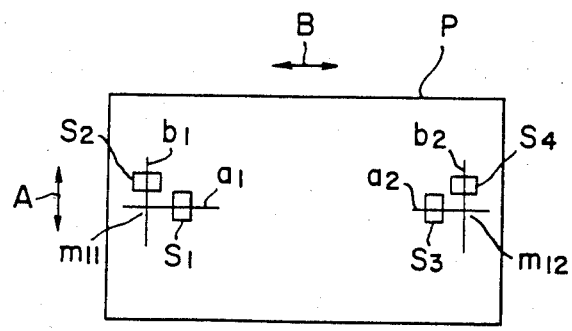
FIG. 30 is a plan view indicating positional relationships between register marks and detectors.

The optical detectors in the aforedescribed detecting-inscribing units 27 respectively have two pairs of detection areas $S_1$, $S_2$ and $S_3$, $S_4$. As shown in FIG. 30, these detection areas are disposed, in plan view, to coincide with register mark configurations. The register lines $a_1$ and $a_2$ in the lateral direction (arrow direction B) of the register marks $m_{11}$ and $m_{12}$ on the left and right side are at a fixed position at the center of the plate P or near a position one-fourth of the dimension of the plate P as viewed in the rotational direction from an edge perpendicular to that direction or, further, in any of numerous specific positions. For this reason, a number of such specific positions are memorized beforehand, and these positions are selected by manipulation of the selection switch 71. Furthermore, on the hypothesis of an extremely rare case, in the case of special positions other than these positions, the positions are designated by means of the keyboard 72 for information input.

Figure 33:
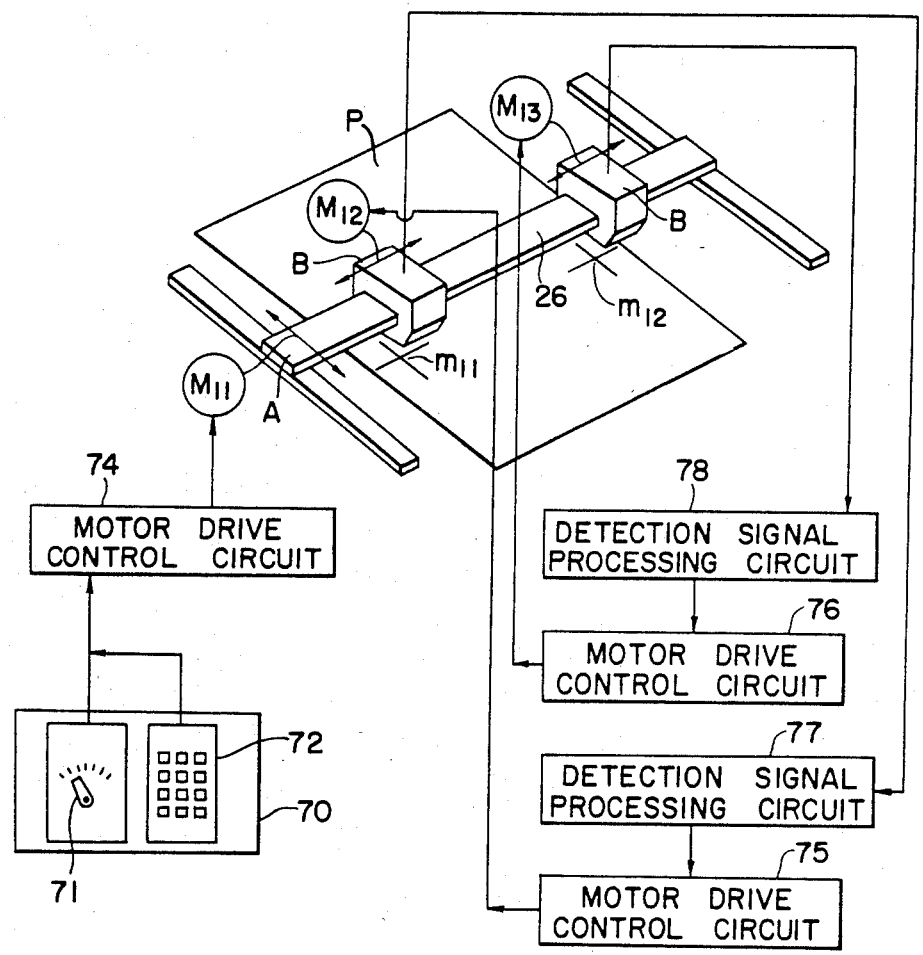
FIG. 33 is a combination of a perspective view and a block diagram indicating a mode of control according to the invention.

However, since the positions of the register lines $b_1$ and $b_2$ extending in the rotational direction of the plate P vary with the dimensions of the printed matter, they cannot be simply set beforehand. Furthermore, the slide bar 26 is driven in movement along the guide rails 20$b$ by a slide mechanism including a motor $M_{11}$, and the detecting-inscribing units 27,27 are driven in movement along the slide bar 26 by respective slide mechanisms including motors $M_{12}$ and $M_{13}$, as indicated in FIG. 33.

Next, the procedure of automatic determination of the positions of the detecting-inscribing units 27,27 will be described with reference to FIGS. 30 through 33.

First, the setting of the position of the detecting-inscribing units 27,27 in the rotational direction A will be considered. In this direction, the register marks are at a fixed position at the center or near ¼ points from an edge to be bent of the plate P or any of various other specific positions. For this reason, the position memorized beforehand is selected by the switching of the selection switch 71 of the control panel 70. When a starting switch among the various switches 73 on the control panel 70 is manipulated, the motor $M_{11}$ is driven by way of a motor drive control circuit 74, whereby the slide bar 26 moves and automatically stops at the selected position.

With the above described parts in this state, register lines have not entered the two pair of detection areas $S_1$, $S_2$ and $S_3$, $S_4$ of the detecting-inscribing units 27, but the detecting areas $S_1$ and $S_2$ are positioned on extensions of the register lines $a_1$ and $a_2$ and positioning of the detecting-inscribing units 27,27 in the rotational direction A is being carried out. If the position of the register lines $m_{11}$ and $m_{12}$ is at special location other than a position which can be selected by means of the selection switch 71, that position is introduced as input by means of an information input key on the control panel 70 thereby to cause the slide bar 26 to move automatically.

Figure 31:
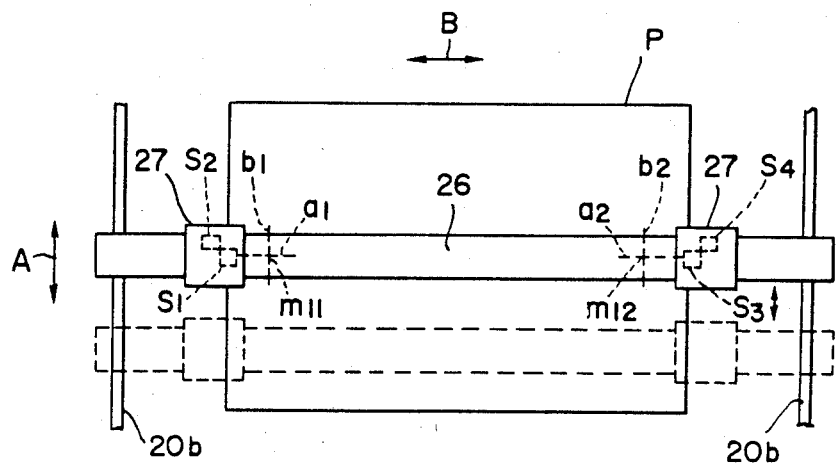
FIGS. 31 and 32 are plan views for description of shifting states of detectors relative to register marks on a printing plate.

Next, the setting of positions of the detecting-inscribing units 27,27 in the left-right or lateral direction B will be considered. When the above described positioning in the rotational direction A is carried out, the control of the positioning of the detecting-inscribing units 27,27 is shifted successively to control of positioning in the lateral direction. At this time, the detecting-inscribing units 27,27 are at positions as indicated in FIG. 31, and the detection areas $S_2$ and $S_4$ for detecting the register lines $b_1$ and $b_2$ are on the outer sides of the sensitized plate P.

With this as the initial state, the left and right detecting-inscribing units 27,27 are caused to move mutually independently toward the center by driving the motors $M_{12}$ and $M_{13}$ through respective motor drive control circuits 75 and 76. When the detectors detect the entrance of the register lines $b_1$ and $b_2$ into the detection areas $S_2$ and $S_4$, respectively, their signals are processed in detector signal processing circuits 77 and 78, the outputs of which are transmitted to the motor drive control circuits 75 and 76, which thereupon automatically stop the detecting-inscribing units 27,27.

Figure 32:
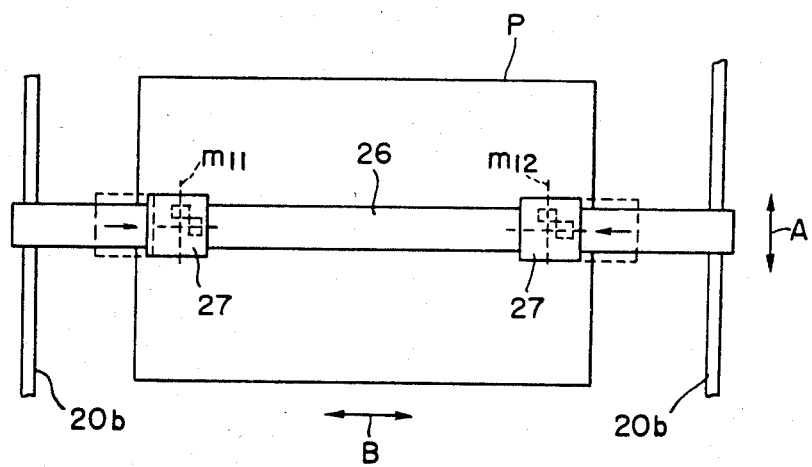

By the above described operation, the register lines are brought into the detection areas within the detectors, as shown in FIG. 32, and automatic positioning of the detecting-inscribing units 27,27 is thus accomplished.

In multicolor printing, a plurality of sensitized plates (for example, four plates in four-color printing) are used, and the register mark positions are common for all of the color plates. The plates are successively and automatically bent in the aforedescribed plate bending machine. At the time of inscribing register marks in this process step, each detector moves together with the corresponding inscriber in the case where the inscriber and the detector are integrally constructed. Consequently, the positional relationship of the detectors which has been initially set is disturbed, and unless the detectors are restored to the same positions, the multicolor registering cannot be accomplished.

For this reason, when positioning of the detectors for the first plate is carried out, the detector positions are stored in a microcomputer memory, thereby assuring that, even when the detectors move at the time of inscribing of register marks, they will be restored to these initial positions. Then, for the second plate and the plates succeeding thereafter, by bringing the plate to the same position as that of the first plate, the detectors are placed above the register marks of the plate P, and the register marks are accurately and positively within their respective detection areas. The positioning or locating of each plate is accomplished by using three detection areas through the combination of $S_1$,$S_2$, and $S_3$ or $S_1$,$S_3$, and $S_4$ of the detection areas of the left and right detectors.

If, during this positioning, the register marks do not enter the detection, the aforedescribed shiftable table 23 is caused to shift, as indicated in FIG. 11, in one of the left and right directions by the distance $n_0$ (a distance less than the extension length of the register line from the center of the cross or plus shaped register mark) and in the other direction by the distance $2n_0$ and then to shift in one of the rotational, or up and down, directions by the distance $n_1$ and in the opposite direction by the distance $2n_1$ until the register marks enter the fields of detection of the sensors. Thus, the register marks are caused to enter the detection areas.

As another possible embodiment of this invention, a specific number of slide bars 26 are fixedly installed at fixed positions at the center and near the aforementioned ¼ point of the plate bending machine at other necessary positions thereof, and the detectors on these slide bars are selected in accordance with the positions of the register marks on the sensitized plate by switching of switches on the control panel 70, positioning in the lateral direction being carried out by moving the detectors in the lateral direction.

By the method of this invention, even when the initial setting in the automatic plate positioning procedure is a very rough setting action wherein the plate is brought into abutment with a positioning stop (e.g., the inner wall surface of the machine casing), the operation is extremely accurate and positive and high bending efficiency is attained since the detecting-inscribing units 27 are brought automatically above respective register marks.

Second register marks $m_2,m_2$ of reclining V shape for second registering as shown in FIG. 5 are inscribed by the aforedescribed inscribing heads 16 or 27a in the vicinity of the first register marks $m_0$ and $m_1$ or $m_{11}$ and $m_{12}$ on the printing plate P set in the standard position by causing the shiftable table 7 or 23 to shift in the above described manner.

The printing of the second register marks can be carried out by a known method such as the letterpress method, the lithographic method, or the screen printing method.

In the plate bending machine $M_2$ illustrated in FIGS. 6, 7, and 8, the operation does not differ essentially from that of the first described plate bending machine $M_1$ except for the provision of a slide bar 26 caused to move along guide rails 20b in correspondence with the positions of register marks thereby to move the detecting-inscribing units 27,27 in the plate rotational direction and the adaption of the detecting-inscribing units 27,27 to move directly on the slide bar 26 in the lateral direction of the printing plate P. The operation of inscribing the second register marks in this case can be carried by methods other than that described hereinbefore. For example, this register marks can be inscribed by causing inscribing pens to move up and down and the detecting-inscribing units to move in the manner of a plotter of an automatic drafting machine.

The succeeding process step is the plate bending step in which the opposite edges of the printing plate parallel to the lateral direction are bent. The step is carried out by lowering the clamping heads 3,3 by turning the handles 4a,4a, ... 4a of the screw shafts 4,4, ... 4 thereby to clamp the opposite edges of the printing plate against the plate bending dies 2a,2a, and causing the bending heads 6,6 to rotate downward. In the plate bending machine $M_1$ shown in FIG. 1, the pin hole punchers 18 also descend together with the clamp heads 3, whereby the positioning pin holes 17 (FIG. 9) are formed simultaneously with the bending of the plate edges.

When the printing plate P is mounted on a plate cylinder 80 as shown in FIG. 35, these positioning pin holes 17 engage respectively with positioning pins 81,81, and 82 fixed to and projecting outward from the plate cylinder 80 near its two ends. These pin holes 17 in the plate P function cooperatively with the pins 81,81, and 82 of the plate cylinder 80 to determine the position of the plate P in its lateral direction relative to the plate cylinder 80. More specifically, the position of the printing plate P in its rotational direction relative to the plate cylinder 80 is determined by the engagement of its bent edges $P_0$ with slits in the plate cylinder 80, but deviant displacement of the plate P in the lateral direction thereof cannot be restricted by this engagement. For this reason, the engagement of the positioning pins 81,81, and 82 with the pin holes 17 becomes necessary. Since these pin holes 17 are fomed in the case of position determination on the basis of pattern datum, the precision is improved considerably over that of pin holes formed beforehand at the time of photoprinting.

The inscribing of the second register marks $m_2$ may be carried out after this plate bending step. When the plate bending step and the step of inscribing second register marks have been completed, the plate P is mounted on the plate cylinder 80 as indicated in FIGS. 36 and 37. For this purpose, the plate cylinder 80 is provided along an element of its cylindrical surface with a groove having spaced-apart outer edges, one of which will be called a leading edge 80a and the other a trailing edge 80b. First, one of the bent parts $P_0$ of the plate P is inserted into a slit formed in the groove between the leading edge 80a and a wind-up shaft 83 inserted through the plate cylinder 80 parallelly to the axis thereof. This bent part $P_0$ is thereby caught in the slit as shown in FIG. 37a. Then, as the plate cylinder 80 is rotate in the arrow direction, the plate P is wrapped around its cylindrical surface until the other bent part $P_0$ of the plate P reaches the trailing edge 80b and is inserted into the groove around the trailing edge. This bent part $P_0$ is thereby inserted into a slit 83a formed in the wind up shaft 83 in its axial direction as shown in FIG. 37b. The wind-up shaft 83 is then rotated in the arrow direction as indicated in FIG. 37c thereby to wind the plate P into a tightly wrapped state around the plate cylinder 80.

In the method of this invention, as described above, conventional printing plates P on which datum fine lines of register marks have been photoprinted are used. First, the positions of datum fine lines of register marks or the like photoprinted on each printing plate P laid on the shiftable table of a plate bending machine of the invention are detected by optical sensors mounted on the plate bending machine, and, in response to signals generated by this detection, the shiftable table is so moved that the datum fine lines are placed at prescribed positions, the plate thus being fixed in position. Then, on the left and right sides of the printing plate P, new (second) register marks for use in registering on the printing press are inscribed, and, at the same time, pin holes for precise engagement with datum positioning pins for plate mounting provided on the plate cylinder of the printing press are formed at prescribed positions in the plate. In addition, the edge portions of the plate on opposite sides parallel to the lateral direction are bent. Then, after completion of this plate bending step, second registering is carried out by the ordinary method.

Thus, in the plate bending machine of this invention, the plate bending, the punching of the pin holes, and the inscribing of the second register marks to be used for automatic registering at the time of printing are carried out with respect to printing plates P of a number corresponding to the number of printing colors with the register mark photoprinted on the printing plate P as the datum reference. For this reason, the pin holes, the positions of the second register marks, the plate bend positions, etc. of all printing plates P are in exact coincidence, whereby the precision of each is superior by far to that attainable heretofore. By this method, even considering the mechanical errors of the set sensitized plates, the bending machine, and the mounting on the plate cylinders, deviant displacements can be held within a range of ±0.3 mm, which can be automatically corrected in the printing press.

Because the second register marks are to be read out at the time of operation of the printing press, marks of thicknesses of at least 0.2 mm are preferred, in contrast with the aforedescribed datum fine lines.

The reading out of second register marks is divided into the case of reading out from the plate cylinder and the case of reading out from a printed matter.

Figure 38:
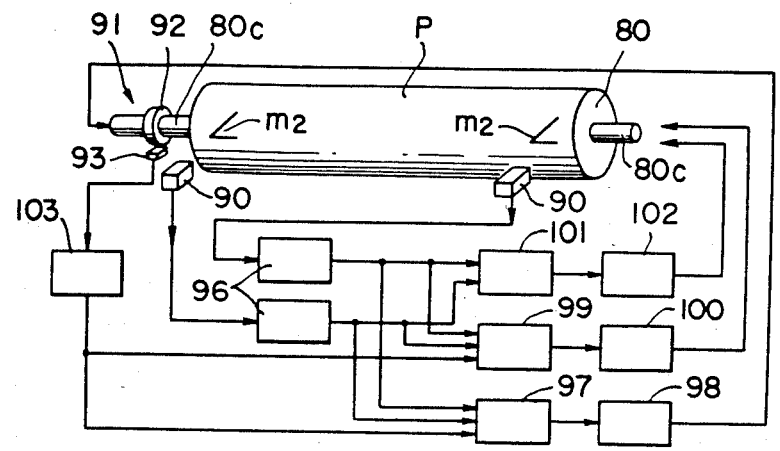
FIG. 38 is a combination of a schematic perspective view and a block diagram showing a system for correcting error quantities in registering.

In the case of reading out from the plate cylinder, optical sensors 90,90 are provided at positions confronting the plate surface of each plate cylinder as shown in FIG. 38. In the case of reading from a printed matter, the optical sensors are installed in a position in the web path through which the paper for printing passes.

On the rotating shaft 80c of the plate cylinder is provided a datum point setting device 91 comprising a setting ring 92 disposed coaxially around the rotating shaft 80c and a sensor 93 for detecting the setting ring 92 when it arrives at a previously set reference position. The sensor 93 is connected to a datum point signal generator 103.

Figures 39A, 39B, 39C:
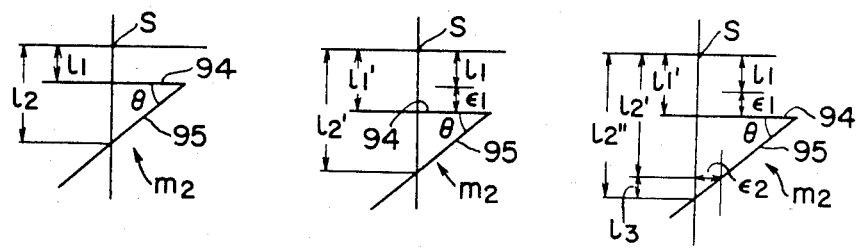
FIGS. 39a, 39b, and 39c are plan views for an explanation of the principle of the system shown in FIG. 38.

The optical sensors 90,90 on the left and right determine, as indicated in FIG. 39, the distances between a datum point S set by the datum point setting device 91 and a horizontal fine line 94 of the register mark $m_2$ and between the datum point S and an inclined fine line 95 forming an angle $\theta$ with the horizontal fine line 94. When the registering is correct, the distances from the datum points S to respective fine lines 94 and to respective fine lines 95 of all marks of a plate cylinders will become respectively equal. The state of the register mark in each plate cylinder will then become as indicated in FIG. 39a.

In the case where, between one plate cylinder and another plate cylinder, an error of $\epsilon_1$ is detected in only the rotational direction with respect to the distance from the datum point S as indicated in FIG. 39b, the resulting detection signal is passed through a mark detecting circuit 96 and introduced as input into a circuit 97 for detecting the magnitude of error in the rotational direction. A motor driving circuit 98 for plate cylinder phase correction then operates in response to the resulting output signal from this circuit 97 to match the rotational phases of all plate cylinders.

Furthermore, in the case where each of the left and right register marks $m_2$ of a certain plate cylinder is deviantly displaced equally in both the rotational direction and the lateral direction as indicated in FIG. 39c, the deviation $\epsilon_1$ in the rotational direction is corrected in the above described manner. At the same time, the deviation $\epsilon_2$ ($= l_2'' - l_2' = l_2'' - l_2 - \epsilon_1 = l_3 \tan (90° - \theta)$) in the lateral direction is detected by a circuit 99 for detecting the magnitude of error in the lateral direction, and the resulting detection signal from this circuit 99 is fed as input into a circuit 100 for driving the plate in the lateral direction. As a result, the plate cylinder itself is moved in the lateral direction and thereby positionally corrected by known means.

When, on one plate cylinder, the distance between the datum point S and the inclined line 95 of the right register mark $m_2$ is different from that between the datum point S and the inclined line 95 of the left register mark $m_2$($l_2''$ of the right register mark $\neq l_2''$ of the left register mark), this indicates that the plate P is mounted in a twisted state on the plate cylinder. Therefore, this twist error ($l_2''$ of the right register mark $- l_2''$ of the left register mark) is detected with a twist magnitude detection circuit 101, the detection output of which is fed into a twist correction motor driving circuit 102.

Figure 40:
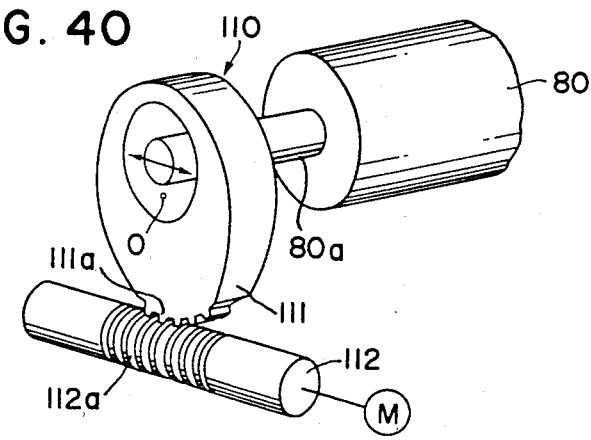
FIG. 40 is a perspective view of a cocking device.

Twist correction is carried out by means of a known cocking device 110 as shown in FIG. 40. That is, the plate cylinder 80 is so rotatably supported that its operative side can be moved forward and rearward relative to its driven side (grear side). This movement can be caused by rotating a rotating shaft bearing 111 mounted around the rotating shaft 80a of the plate cylinder with an upward eccentricity through a very small angle of rotation by means of a driving shaft 112 driven in rotation by the above mentioned twist correction motor driving circuit 102.

The rotating shaft bearing 111 is provided at its lower part with screw threads 111a constituting a sector gear which is meshed with screw threads 112a formed around the driving shaft 112 and constituting a worm gear. When the driving shaft 112 is rotated, it causes the rotating shaft bearing 111 to rotate about its center O, whereby the corresponding end of the rotating shaft 80a of the plate cylinder 80 is moved slight in the left-right direction as viewed in FIG. 40, or substantially parallelly to the driving shaft 112. This correction results in a deviation of the tangential line between the plate cylinder and the blanket cylinder, which is not desirable from the standpoint of machine construction, and therefore the quantity of correction is ordinarily held within ±0.3 mm.

If, after correction of the plate cylinder, the register mark $m_2$ is further read out, and the correction quantity is still unsuitable, a recorrection signal is generated, and in this manner, feedback control is carried out.

In the case of reading out register marks from a printed article, a total of four front and back sensors are provided in the web path for each plate cylinder. In this case, since reading out will become difficult if register marks become overlapped, the register marks are printed on the plate bending machine side so that they will be at a certain spacing between the multiple colors. Furthermore, because the register marks are newly entered into a non-image part of the plate, it is necessary that these marks become image parts at the time of printing. Therefore, in the case of reading out from a printed article, it is desirable that printing be carried out with a material capable of becoming an image such as, for example, an oil-base laquer.

What is claimed is:

1. A plate bending machine for bending the lateral edges of printing plates for use in an offset printing press, said machine comprising: a machine bed; plate bending mechansims supported on opposite sides of the machine bed; a shiftable table mounted on the machine bed between the bending mechanism in a manner whereby said table can be shifted freely in any horizontal direction along the upper surface of the machine bed and functioning to securely hold a printing plate mounted thereon; at least one detectin-inscribing unit comprising at least one optical detection sensor to detect datum fine lines inscribed on each of the printing plates held on the shiftable table thereby to generate signals for causing the shiftable table to shift to a specific position; a driving system mounted on the machine bed and coupled to the shiftable table for operating in response to the signals to thus cause the shiftable table to shift to the specific position; and a registered mark inscribing device coupled to the detecting-inscribing unit for inscribing register marks on the printing plate thus held on the shiftable table for an automatic registration on a cylinder plate, which detecting-inscribing unit is so mounted on the machine as to be movable over and along the surface of the shiftable table.

2. A plate bending machine according to claim 1 in which pin hole punchers for punching pin holes in the printing plate are provided in the plate bending mechanisms, the pin holes being thus formed for insertion therein of positioning pins for mounting of the plate in positioned state on the corresponding plate cylinder.

3. A plate bending machine according to claim 1 in which each of the optical detection sensors has a main detecting element and a subdetecting element disposed in mutually spaced-apart state in the direction in which a corresponding datum fine line to be detected thereby extends.

4. A plate bending machine according to claim 1 in which each optical detection sensor comprises a light source for lighting a fine line on the printing plate, an optical filter for filtering out light of wavelengths of 480 nm or less of the light projected from the light source, a light-receiving element provided with a light-receiving surface divided into two sections for receiving light reflected from the surface of the sensitized plate and having a sensitivity peak in a wavelength range of 550 to 650 nm, a lens system for forming on the light-receiving surface an image of the fine line on the sensitized plate, and a casing for accommodating the above named parts.

5. A plate bending machine according to claim 4 in which the sensitivity of each light-receiving element becomes 1/10 or less of the peak value when the wavelength of the reflected light is 700 nm or greater.

6. A plate bending machine according to claim 3 in which each light-receiving surface is divided into two sections by a straight boundary line.

7. A plate bending machine according to claim 6 in which each light-receiving surface is formed as two bisected sections on one end of a bundle of optical fibers, and two independent light receiving elements are disposed on the other end of the optical fiber bundle respectively at positions corresponding to the two bisected sections.

8. A plate bending machine according to claim 1, wherein the plate bending mechansims are covered with a casing having an opening at its side for inserting the printing plate in the machine and the detecting-inscribing unit is movably mounted on a slide bar the opposite ends of which are guided on two guide rails provided on the casing.

9. A plate bending machine according to claim 1, wherein the shiftable table is supported by a plurality of ball supports mounted on the machine bed.

10. A plate bending machine according to claim 9, wherein the shiftable table is provided along two adjacent edges thereof with vertical side walls perpendicular to each other, one of the side walls being in contact with the tips of two driving rods provided at an interval, the other of the side walls being in contact with the tip of one driving rod, the respective driving rods being driven in response to signals to thus move the shiftable table.

* * * * *